United States Patent [19]
Connell et al.

[11] Patent Number: 6,023,191
[45] Date of Patent: *Feb. 8, 2000

[54] METHOD AND APPARATUS FOR DETECTING AN INPUT SIGNAL

[76] Inventors: Lawrence Edwin Connell, 2464 Rio Grande Cir., Naperville, Ill. 60565; Mark Joseph Callicotte, 832 Washington Blvd., #A2, Oak Park, Ill. 60302; William Joseph Roeckner, 700 Glacier Pkwy., Algonquin, Ill. 60102

[*] Notice: This patent issued on a continued prosecution application filed under 37 CFR 1.53(d), and is subject to the twenty year patent term provisions of 35 U.S.C. 154(a)(2).

[21] Appl. No.: 08/920,369

[22] Filed: Aug. 29, 1997

Related U.S. Application Data

[63] Continuation of application No. 08/730,164, Oct. 15, 1996, abandoned, which is a continuation of application No. 08/396,093, Feb. 28, 1995, abandoned, which is a continuation of application No. 08/149,481, Nov. 9, 1993, abandoned.

[51] Int. Cl.[7] ..................................................... H03K 5/00
[52] U.S. Cl. .......................... 327/554; 327/558; 327/337; 327/341; 327/362; 327/552; 333/14; 708/312
[58] Field of Search .............................. 333/14; 330/136, 330/90; 708/312; 327/337, 341, 552, 554, 362, 558, 94, 551, 91

[56] References Cited

U.S. PATENT DOCUMENTS

| | | | |
|---|---|---|---|
| 4,429,281 | 1/1984 | Ito et al. | 328/122 |
| 4,584,659 | 4/1986 | Stivoort | 364/724 |
| 4,837,619 | 6/1989 | Tsinbag | 358/140 |
| 4,862,118 | 8/1989 | Kojima | 333/14 |
| 5,142,236 | 8/1992 | Maloberti et al. | 328/26 |
| 5,245,299 | 9/1993 | Bader et al. | 333/14 |
| 5,264,804 | 11/1993 | Fox | 327/558 |
| 5,289,059 | 2/1994 | Pikkarainen | 327/552 |

FOREIGN PATENT DOCUMENTS

| | | | |
|---|---|---|---|
| 1143513 | 6/1989 | Japan | 333/14 |

OTHER PUBLICATIONS

Von Grünigen et al., "Integrated Switched–Capacitor Low–Pass Filter with Combined Anti–Aliasing Decimation Filter for Low Frequencies", *IEEE Solid–State Circuits*, vol. 17, Dec. 1982, pp. 1024–1028.

Haug et al., "Improved Offset–Compensation Schemes for Switched–Capacitor Circuits", *ISCAS*, 1984, pp. 1054–1057.

Matsumoto et al., "Spike–Free Switched–Capacitor Circuits", *Electronics Letters*, 9th, vol. 23, No. 8., Apr. 1987.

Gregorian et al., "Switched–Capacitor Circuit Design", *Proceedings of IEEE*, vol. 71, No. 8, Aug. 1983, pp. 941–966.

Susak et al., "A Low–Current DC–Coupled Compander", IEEE International Solid–State Circuits Conference Paper TP 9.5, 1993, pp. 146–147, 280.

Signetics Product Specification, "NE/SA5750: Audio Processor System for RF Communication", Jan. 9, 1989, pp. 1–6.

(List continued on next page.)

*Primary Examiner*—Dinh T. Le
*Attorney, Agent, or Firm*—Daniel W. Juffernbruch; Brian M. Mancini

[57] ABSTRACT

A level detector detects an input signal level. A rectifier (210) receives the input signal and provides a rectified signal. A prefilter (220) receives the rectified signal and attenuates high frequency components at frequencies near multiples of a decimation sample rate. The prefiltered signal is decimated (230) and low pass filtered by a lowpass filter (240) having a passband below the input frequency of the input signal. The level detector can be provided to control a variable gain stage circuit (935, 1010) which applies a gain to the input signal based on the level to form a dynamic range compressor or expander.

24 Claims, 5 Drawing Sheets

OTHER PUBLICATIONS

Proakis et al., *Digital Signal Processing; Principles, Algorithms and Applications*, Second Edition, 1992, pp. 761–765.

*Webster's II New Riverside University Dictionary*, 1994, p. 353.

*Databook 1993 Radio Communication System ICS*, Sony Corp., CXD1272Q/R Cellular Phone Filter, 1993, pp. 230–245.

*Signetics 1989 Linear Data Manual*, vol. 1: Communications, NE570/571/SA571, Compander, Nov. 14, 1986, pp. 4-341-4-347.

Kumano, Kazuo; Takeda, Kazuhiro; and Yamada, Takaaki; WAM 12.6, "A Low-power CMOS Baseband Processor with Compandor for Cellular Telephones", 9/7803-0479.9, IEEE 1992 International Conference on Consumer Electronics, 1992, pp. 206–207.

Radio Communication ICS Application Engineering pages, Sony Corp. presentation, 1991.

K. Yamakido et al., *IEEE Journal of Solid-State Circuits*, "A Single-Chip CMOS Filter/Codec", vol. SC-16, No. 4, Aug. 1981, pp. 302–307.

D. Marsh et al., *IEEE Journal of Solid-State Circuits*, "A Single-Chip CMOS PCM Codec with Filters", vol. SC-16, No. 4, Aug. 1981, pp. 308–315.

R. Gregorian et al., *IEEE Journal of Solid-State Circuits*, "An Integrated Single-Chip PCM Voice Codec with Filters", vol. SC-16, No. 4, Aug. 1981, pp. 322–332.

Y. Kuraishi et al., *IEEE Journal of Solid-State Circuits*, "A Single-Chip NMOS Analog Front-End LSI for Modems", vol. SC-17, No. 6, Dec. 1982, pp. 1039–1044.

J. Candy et al., *IEEE Journal of Solid-State Circuits*, "Precise Biasing of Analog-to-Digital Converters by Means of Auto-Zero Feedback", vol. SC-17, No. 6, Dec. 1982, pp. 1220–1225.

K. Yamamoto et al., *IEEE Journal of Solid-State Circuits*, "An Analog Front End for 2400-bit/s Split-Band Full-Duplex Modems", vol. SC-21, No. 6, Dec. 1986, pp. 941–946.

S. Daubert et al., *IEEE Journal of Solid-State Circuits*, "A CMOS Modem Analog Processof for V.22bis Modems", vol. SC-24, No. 2, Apr. 1989, pp. 281–291.

METHOD AND APPARATUS FOR DETECTING AN INPUT SIGNAL

This is a continuation of application Ser. No. 08/730,164 filed Oct. 15, 1996, now abandoned, which is a continuation of application Ser. No. 08/396,093 filed on Feb. 28, 1995 and now abandoned, which is a continuation of application Ser. No. 08/149,481, filed Nov. 9, 1993 and now abandoned.

BACKGROUND OF THE INVENTION

1. Technical Field of the Invention

The present invention relates to a level detector and, more particularly, relates to devices employing level detection of an input signal.

2. Description of the Related Art

Circuits for detecting the level of a signal typically rectify and filter the signal to derive a predetermined measure of the signal amplitude such as, e.g., an average level or a root mean square (RMS) level. Rectifiers such as full wave diode rectifiers are used. After rectification by a full wave rectifier, the output is filtered by a lowpass filter to create a meaningful DC level. Level detectors have been used in applications such as automotive control systems, light and sound intensity detectors, and dynamic range compandors.

A compandor allows the dynamic range of communications signals to be altered for transmission or reception over a communication medium. Such communication medium can be wired or wireless mediums. To decrease an amount of bandwidth or dynamic range required on the communication medium, a communication signal is companded. When companding, the communication signal is compressed before transmission over the communication medium and then expanded (decompressed) after reception over the communication medium. A level detector is used to determine an amount of compression needed on the input signal for transmission over the communication medium. Similarly, a level detector is used for detecting a level of a signal received over the communication system and expanding the signal based upon the detected level.

FIG. 1 illustrates a level detector applicable to a compandor of the prior art. A rectifier 110 rectifies an input signal 105 to produce a full-wave rectified signal 112. Rectified signal 112 is lowpass filtered with a single pole RC time constant determined by a combination of a switched-capacitor 125, switches 115, 120, 130 and 135, and a capacitor 145, producing output signal level 150. Rectifier 110, switched-capacitor 125 and switches 115, 120, 130, 135 are formed in an integrated circuit chip. Capacitor 145 is an off-chip capacitor due to its large capacitance. The large off-chip capacitor 145 must be connected to the integrated circuit chip via a pin connection 140. Placing the large capacitor 145 on the integrated circuit chip would be impractical because its large capacitance would consume a substantial portion of the integrated circuit chip.

The components of the FIG. 1 level detector have been fully integrated to the maximum capacity that was known in the prior art. The switched-capacitor 125 and the switches 115, 120, 130, 135 have been provided to emulate a resistor. An on-chip resistor would consume a greater area of the integrated circuit chip than the switched-capacitor implementation. The switched-capacitor 125 thus avoided placing this resistor off-chip. However, on-chip integration of the large off-chip capacitor 145 has heretofore been impractical.

For most level detection applications, a relatively low 3 dB corner frequency is required for the lowpass filter. For companding applications of voice band signals a corner frequency on the order of 10 Hz is often desired. The 3 dB corner frequency for the prior art shown in FIG. 1 is given by:

$$3 \text{ dB corner frequency} = f_s C_{125}/2\pi C_{145} \quad (1)$$

where $f_s$ is a sampling clock frequency controlling the switches of FIG. 1, $C_{125}$ is the capacitance value of capacitor 125, and $C_{145}$ is the capacitance value of capacitor 145. Sampling of voice signals must be at a sufficiently high rate so as to avoid aliasing, thus a typical sample rate might be 32 kHz. For a desired 3 dB corner frequency of 10 Hz and using a sample frequency of 32 kHz equation (1) produces an extremely large capacitor ratio of approximately 500 to 1. Such a large capacitor ratio becomes impractical or impossible to integrate, and requires a large external capacitor be used. Additionally, with an external capacitor, board leakage currents become an issue and can cause capacitor 145 to become extremely large and range anywhere from 0.01 microfarad to 10 microfarad. Also, extra cost is incurred for both an external capacitor and its needed external connection pin 140.

To reduce the size of electronic devices it is desirable to fully integrate all components such as capacitor 145 on integrated circuit chips. Previous attempts to do so have been unsuccessful due to the aforementioned problems.

BRIEF DESCRIPTION OF THE DRAWINGS

The many constructions and features of the present invention will become more apparent from the detailed description when read in conjunction with the following drawings.

DETAILED DESCRIPTION OF THE PREFERRED EMBODIMENTS

The present invention solves the above mentioned and other problems by providing the following and other features of the invention. A level detection method and apparatus detects a level of an input signal. A rectifier rectifies the input signal. A prefilter attenuates high frequency components of the rectified signal. A time-sampled lowpass filter receives the prefiltered signal from the prefilter and outputs the level. According to other embodiments in which the prefilter is a time-sampled filter, a decimator is provided to sample the prefiltered signal samples from the prefilter and provide decimated samples of the prefiltered signal to said time-sampled lowpass filter. The level detector can control a variable gain stage circuit which applies a gain to the input signal based on the level to form a dynamic range compressor or expander. Such constructions according to the present invention can be fully integrated in an integrated circuit chip without the need for off chip components.

Figure 1:
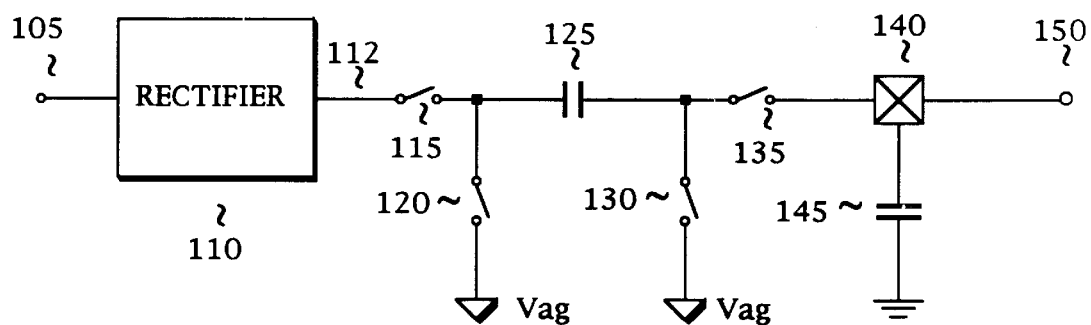
FIG. 1 illustrates a schematic block diagram of a prior art level detector.
Figure 2:
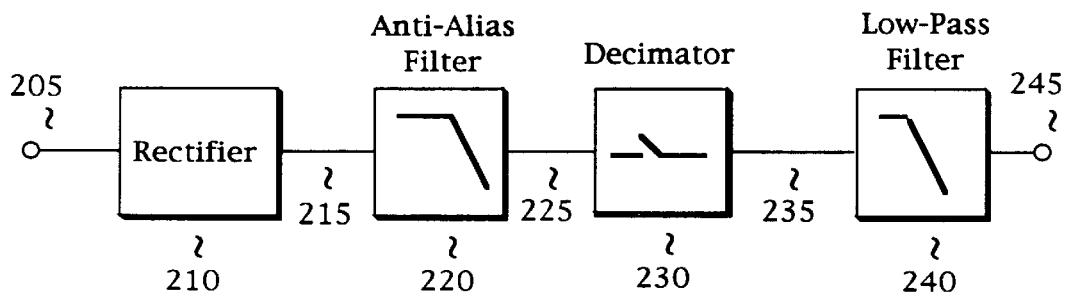
FIG. 2 illustrates a schematic block diagram of a level detector according to the present invention.

FIG. 2 illustrates a level detector according to the present invention. The components of the level detector are fully integrated on a single integrated circuit chip. Full integration of the components and elimination of a large capacitor is accomplished by providing a prefilter 220 and a decimator 230 after rectification by a rectifier 210. After the prefilter 220 and decimation, a time-sampled lowpass filter 240 is provided having a passband and sample rate determined in accordance with the passband of the prefilter and the frequency of the input signal. The prefilter 220 is preferably an antialiasing filter for the purpose of avoiding repeated spectrum interference that could be caused by sampling in the level detector.

The rectifier 210 acts on the input signal 205 to produce a rectified signal 215. The prefilter 220 lowpass filters the rectified signal 215 to remove high frequency components and produce a time-sampled signal 225. Decimator 230 takes the time-sampled signal 225 and re-samples it at a much slower rate producing a decimated time-sampled signal 235. Time-sampled lowpass filter 240 samples signal 235 at the decimation rate and removes additional high frequency components producing the desired output level 245.

In a typical application the input signal 205 might be a voice signal band limited between 300 and 3000 Hz. In this case, a typical anti-alias filter 220 might consist of a second order time-sampled lowpass filter with a 3 dB corner frequency at 200 Hz. A typical sample rate for this filter might be 32 kHz. The decimator 230 might typically perform a 16 to 1 decimation, resulting in a signal at node 235 sampled at 2 kHz. The lowpass filter 240, time sampling at the decimation rate of 2 kHz, might typically have a first order lowpass response with a 3 dB corner at less than 10 Hz. This very low frequency pole would then result in an output signal 245 which would slowly track the amplitude or level of the input voice waveform.

Both the order and the 3 dB corner frequency of time-sampled lowpass filter 240 determine the final response time of the level detector to changes in the level of the input signal 205. Typically a relatively slow response time is desired in order to produce a steady output level signal with small ripple. Thus, for the voice signal application, a first order corner frequency of less than 10 Hz is typical. If a faster or slower response time were desired then the corner frequency of the lowpass filter could be changed appropriately.

Efficient realization of a time-sampled lowpass filter with such a low corner requires a low sample rate. However, the sample rate must be sufficiently high so as to not significantly distort the output signal level at 245. Anti-alias filter 220 must remove high frequency signal components near integral multiplies of the lowpass filter 240 sampling rate in order to minimize aliasing by the lowpass filter. In the above example the anti-alias filter 220 will attenuate frequencies at 2 kHz by 40 dB. Since, in the above example, a time-sampled rectifier 210 and/or anti-alias filter 220 must process signal frequencies in the 300 to 3000 Hz range, a typical oversampling rate of 32 kHz was chosen.

It should be noted that, in the general case, rectifier 210 and anti-alias filter 220 may be continuous time circuits. This would eliminate the need for decimator 230 since lowpass filter 240 would then be the only time-sampled circuit block.

A level detector built in accordance with the present invention can easily and area-effidently be fully integrated on an integrated circuit chip, thus eliminating all external components.

Figure 3:
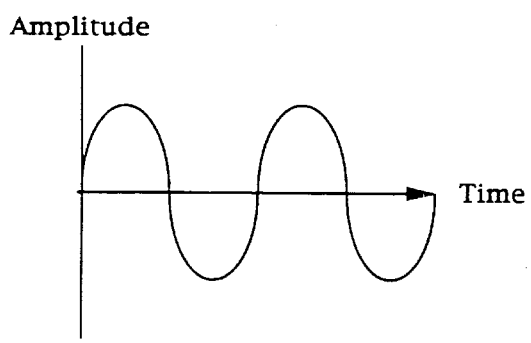
FIGS. 3 through 6 illustrate plots of signal amplitude with respect to time for signals in an example level detector according to the present invention.
Figure 4:
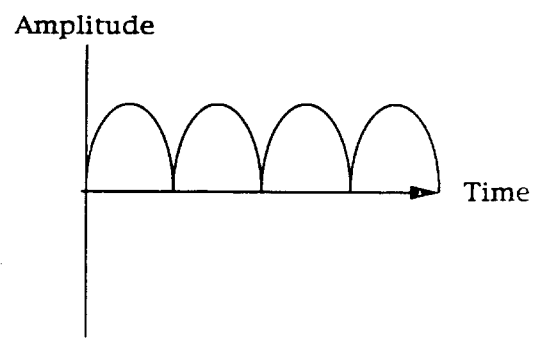
Figure 5:
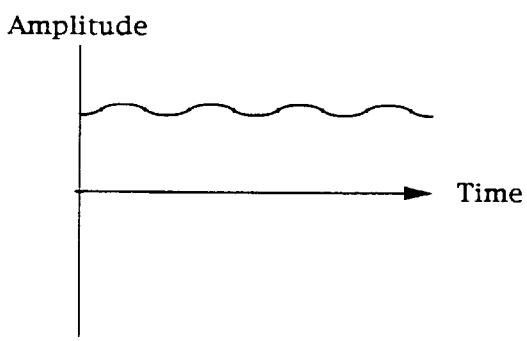
Figure 6:
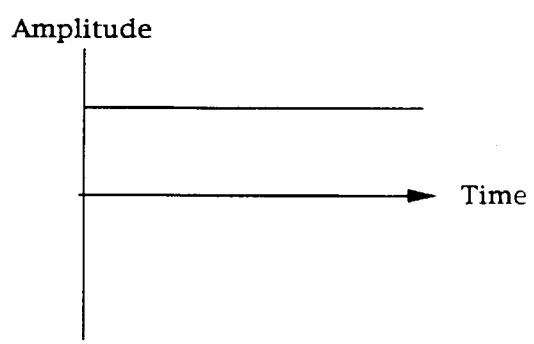

FIGS. 3–6 illustrate plots of signal amplitude with respect to time for signals at particular points in the exemplary level detector of FIG. 2. FIG. 3 illustrates an example of an input signal 205 to be processed by the level detector. This signal may be a voice signal which might have frequencies in the range of 300 to 3000 Hz. FIG. 4 illustrates a rectified signal 215 output of the rectifier 210. Note that the rectified signal 215 in the example illustrated in FIG. 4 is a full-wave rectified signal. FIG. 5 illustrates a prefiltered signal 225 output of the anti-alias prefilter 220. Note that the prefiltered signal 225 waveform shown in FIG. 5 indicates the removal of some high frequency components by anti-alias filter 220. FIG. 6 illustrates a lowpass filtered signal 245 output of the lowpass filter 240. It should be noted that decimator 230 produces a decimated signal 235 output that is essentially unchanged from decimator input signal 225 since the decimator merely re-samples signal 225 at a slower rate than time-sampled anti-alias filter 220. As shown in FIG. 6 the resulting output level waveform 245 in this example is a slow moving "DC-like" signal whose amplitude relates directly to the amplitude of the input signal.

Figure 7:
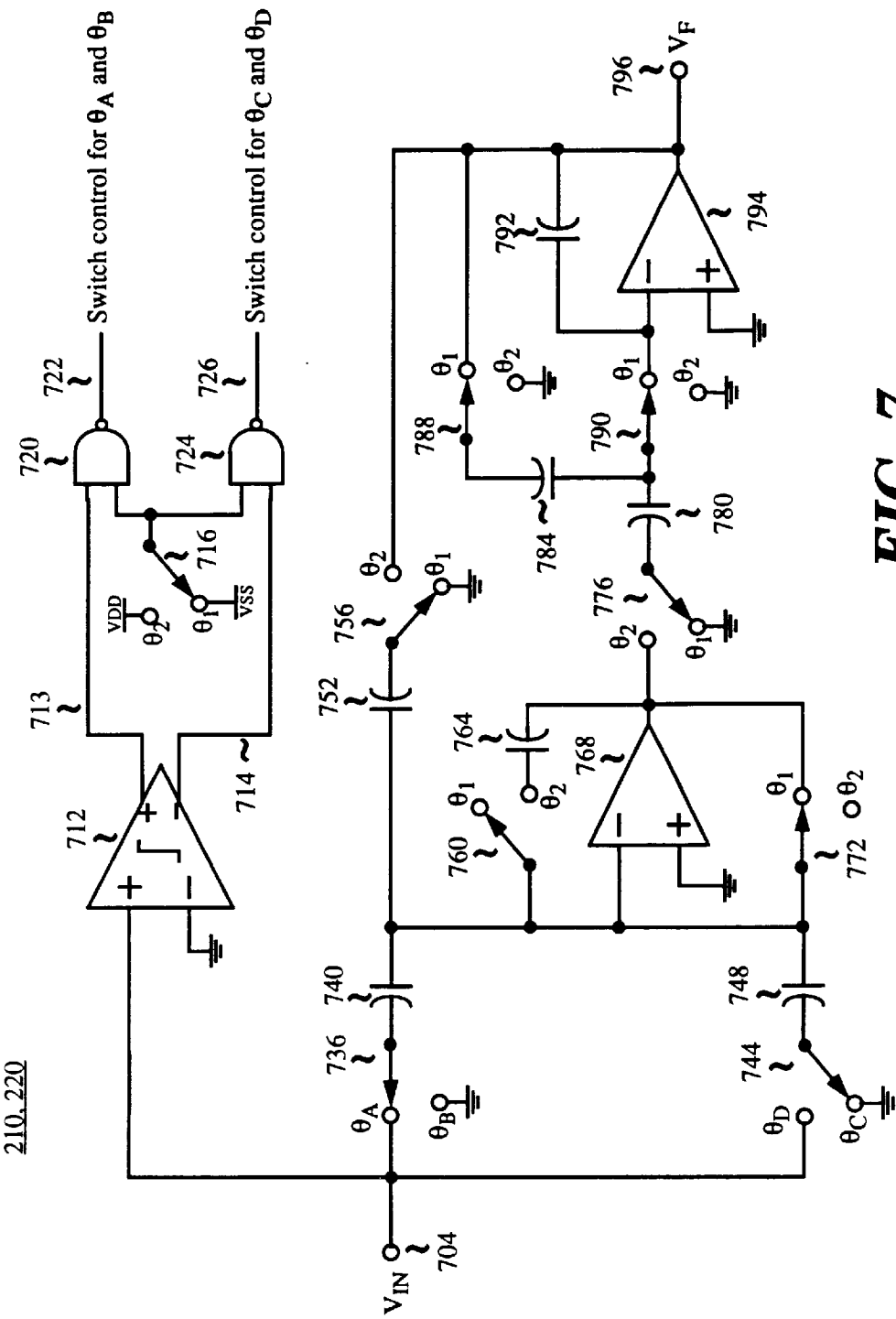
FIG. 7 illustrates a schematic diagram of a rectifier and prefilter according to the present invention.

FIG. 7 illustrates a schematic diagram of a rectifier and prefilter according to the present invention. The input signal $V_{IN}$ applied to node 704 is rectified by means of comparator 712, switch 716, NAND gates 720 and 724, switches 736 and 744, and capacitors 740 and 748. The anti-alias filter consists of an auto-zeroed switched-capacitor biquad filter which is made up of switches 736, 744, 756, 760, 772, 776, 788, and 790, capacitors 740, 748, 752, 764, 780, 784, and 792, and operational amplifiers 768 and 794.

The switches shown in FIG. 7 with labels $\Theta_1$ and $\Theta_2$ attached to them represent toggle-switches driven by a two-phase clock having even ($\Theta_2$) and odd ($\Theta_1$) phases. The switches connect the capacitors to one node or another as indicated by the symbols "$\Theta_1$" and "$\Theta_2$." Switches 736 and 744 also represent toggle switches. However, switch 736 is driven by a two-phase clock having phases $\Theta_A$ and $\Theta_B$ which are controlled by output 722 of NAND gate 720. When control signal 722 of the NAND gate 720 is at a logic one, switch 736 is in the $\Theta_A$ position. When control signal 722 of the NAND gate 720 is at a logic zero, switch 736 is in the $\Theta_B$ position. Similarly, switch 744 is driven by a two-phase clock having phases labeled $\Theta_C$ and $\Theta_D$ which are controlled by output 726 of NAND gate 724. When control signal 726 of the other NAND gate 724 is at a logic one, switch 744 is in the $\Theta_C$ position. When control signal 726 of the NAND gate 724 is at a logic zero, switch 744 is in the $\Theta_D$ position. An actual circuit design would preferably use MOSFET switches.

As shown in FIG. 7 the input signal 704 is applied to both the comparator 712 and the switched-capacitor biquad filter input switches 736 and 744. Rectification of the input signal $V_{IN}$ is accomplished by using comparator 712 to sense the polarity of the input signal, with the resulting polarity used to configure the switched-capacitor biquad filter to be either inverting or non-inverting.

As an example, if $V_{IN}$ at node 704 was above ground, the positive output 713 of comparator 712 would be at a logic one while the negative output 714 of comparator 712 would be at a logic zero. This would disable output 726 of NAND gate 724 forcing switch 744 to the $\Theta_C$ position and thus effectively removing capacitor 748 from the switched-capacitor biquad filter. At the same time, NAND gate 720 would be enabled to allow switch 716 to control $\Theta_A$ and $\Theta_B$ of switch 736 in synchronism with $\Theta_1$ and $\Theta_2$ of the switched-capacitor biquad circuit. By enabling switched-capacitor 740 and disabling switched-capacitor 748, the switched-capacitor biquad filter is placed in a non-inverting configuration. Similarly, if the input signal 704 was below ground, the switched-capacitor 740 would be disabled while switched-capacitor 748 would be enabled, resulting in an inverting configuration of the anti-alias filter. The resulting output $V_F$ at node 796 in this embodiment will be a positive full-wave rectified and filtered signal.

The anti-alias filter of FIG. 7 consists of an offset canceling auto-zeroed switched-capacitor biquad filter used to reduce the input referred offset of amplifier 768. During phase $\Theta_1$, switch 772 shorts out amplifier 768 and causes capacitors 752, 740, and 748 to store its offset. During phase $\Theta_2$, capacitors 752, 740, and 748 supply the stored offset voltage which cancels the offset of amplifier 768.

The DC gain of the biquad is determined by the ratio of input capacitors 740 or 748, depending on which is enabled, to feedback capacitor 752. Input capacitors 740 and 748 must therefore be equal in order to maintain the same gain during both rectification phases. Ratios of the remaining capacitors in the circuit determine the two pole locations of the anti-alias filter.

Figure 8:
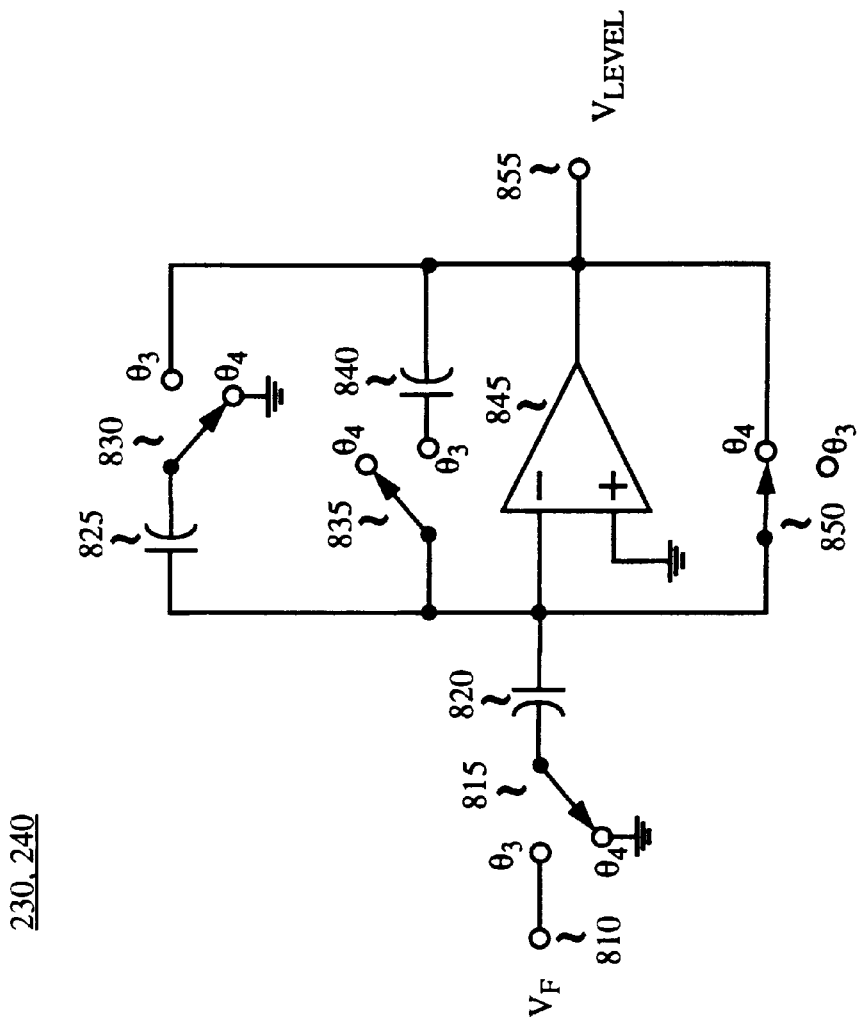
FIG. 8 illustrates a schematic diagram of a decimator and low pass filter according to the present invention.

FIG. 8 illustrates a schematic diagram of a decimator and lowpass filter according to the present invention. The lowpass filter shown in FIG. 8 consists of a single-pole auto-zeroed switched-capacitor filter. As similarly described for the switched-capacitor biquad filter in FIG. 7, the switches shown in FIG. 8 with labels $\Theta_3$ and $\Theta_4$ attached to them represent toggle-switches driven by a two-phase clock having even ($\Theta_4$) and odd ($\Theta_3$) phases. The decimation function is simply implemented by operating this two-phase clock at a slower frequency than the clock associated with phases $\Theta_1$ and $\Theta_2$ of FIG. 7. The single-pole auto-zeroed switched-capacitor lowpass filter shown in FIG. 8 is made up of switches 815, 830, 835 and 850, capacitors 820, 825 and 840, and operational amplifier 845. Output signal $V_F$ at node 796 in FIG. 7 is connected to input signal $V_F$ at node 810 in FIG. 8.

Similar to the biquad in FIG. 7, the lowpass filter in FIG. 8 consists of an offset canceling auto-zeroed configuration to reduce the input referred offset of amplifier 845. During phase $\Theta_4$, switch 850 shorts out amplifier 845 and causes the capacitors 825 and 820 to store its offset During phase $\Theta_3$, the capacitors 825 and 820 supply the stored offset voltage which cancels the offset of amplifier 845. The DC gain of this stage is determined by the ratio of switched input capacitor 820 to switched feedback capacitor 825. The 3 dB pole frequency of this stage is given by:

$$3 \text{ dB pole frequency} = f_s C_{825} / 2\pi C_{840}$$

where $f_s$ is the sampling frequency of the lowpass filter, $C_{825}$ is the capacitance value of capacitor 825, and $C_{840}$ is the capacitance value of capacitor 840. As can be seen by this equation, to achieve a low 3 dB pole frequency, a trade-off exists between the value of the sampling frequency fs and the ratio of the capacitor 840 to the capacitor 825. If one were to clock the time-sampled lowpass filter 240 with the typically high sampling frequency required for processing the frequency content of the original input signal 205 of FIG. 2, then the capacitor ratio and resulting total capacitance required for low offset performance would become much too large for practical integration. However, the present invention allows a much lower sampling frequency $f_s$ to clock the lowpass filter, thus allowing a capacitor ratio that can be easily integrated in an area-efficient manner.

Figure 9:
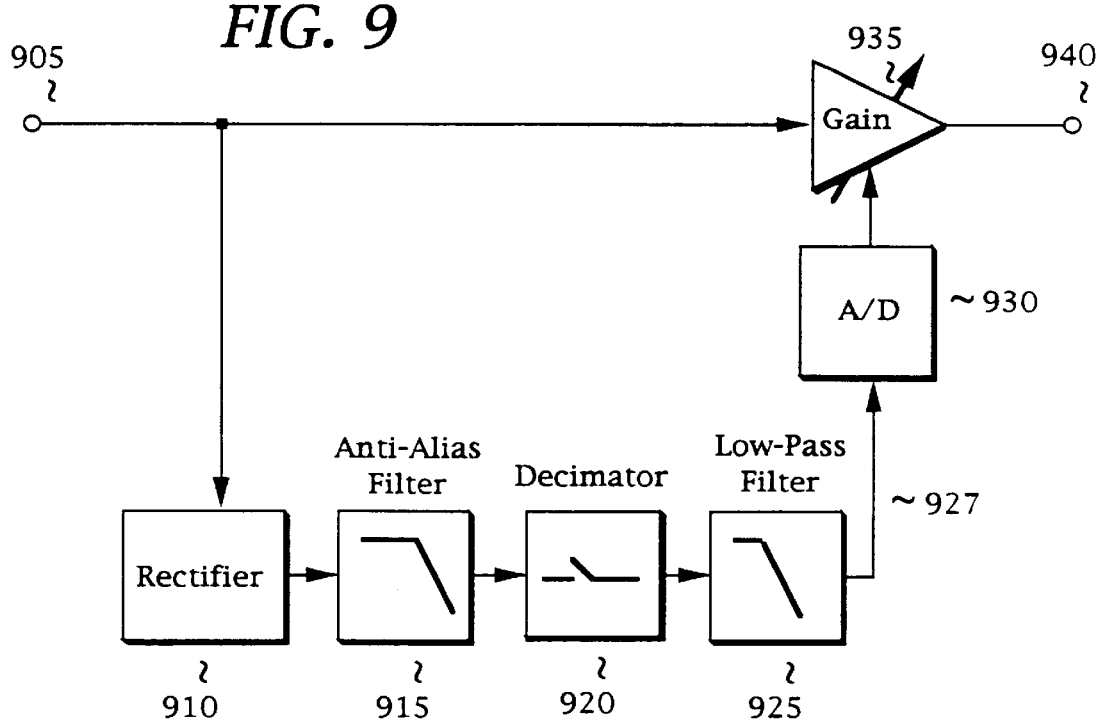
FIG. 9 illustrates a schematic block diagram of an expander according to the present invention.
Figure 10:
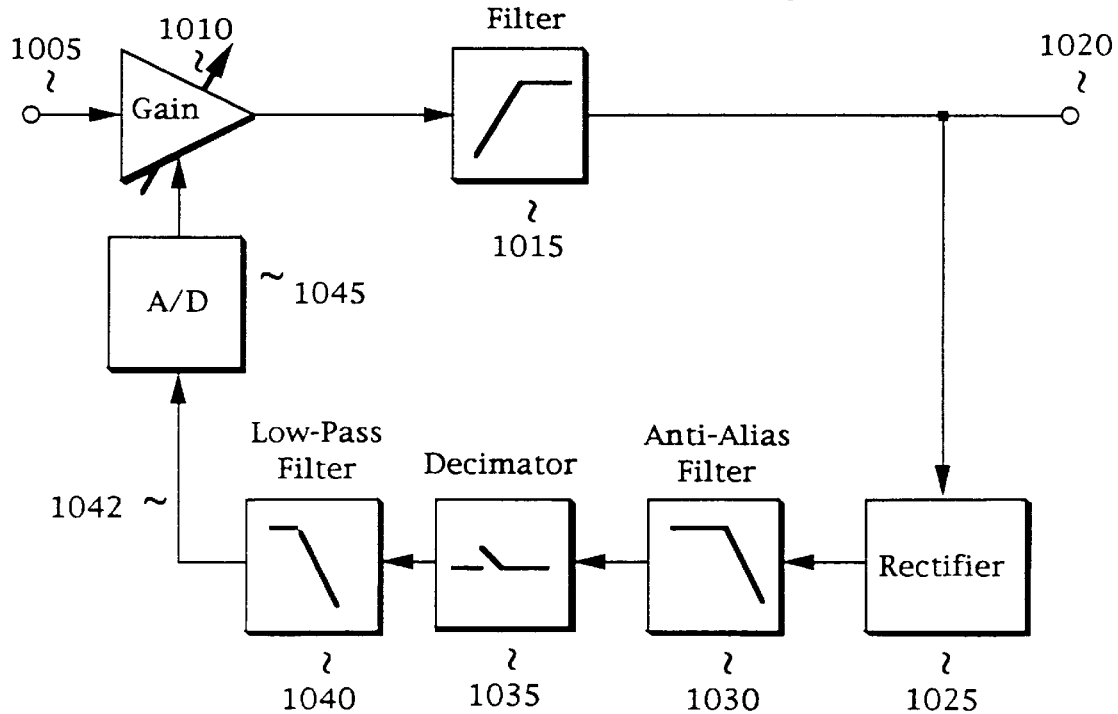
FIG. 10 illustrates a schematic block diagram of a compressor according to the present invention.

FIGS. 9 and 10 illustrate schematic block diagrams of a compandor according to the present invention employing level detection of an input signal. FIG. 9 illustrates an expander according to the present invention. As shown in FIG. 9, a rectifier 910, an anti-alias filter 915, a decimator 920, a lowpass filter 925, and an analog-to-digital converter 930 process an input signal 905. Input signal 905 is also applied to variable gain stage 935. The output of the analog-to-digital converter 930 then controls the gain of variable gain stage 935 to provide typically a one-to-two dynamic range expansion of the original input signal 905.

FIG. 10 illustrates a schematic block diagram of a compressor according to the present invention. Input signal 1005 is applied to the input of a variable gain stage 1010. The output of variable gain stage 1010 is connected to the input of a highpass filter 1015, which is used to removed DC offsets. The output 1020 of highpass filter 1015 is fed back through a rectifier 1025, an anti-alias filter 1030, a decimator 1035, a lowpass filter 1040 and an analog-to-digital converter 1045. The output signal 1042 of the lowpass filter 1040 is digitized by the analog-to-digital converter 1045 which then controls the gain of the variable gain stage 1010. This feedback loop produces an output signal 1020 which is typically a two-to-one dynamic range compression of the input signal 1005.

Although the invention has been described and illustrated in the above description and drawings, it is understood that this description is by example only and that numerous changes and modifications can be made by those skilled in the art without departing from the true spirit and scope of the invention. The present invention is applicable to level detection in numerous applications such as automotive controllers, sound and light detectors or dynamic range companders. Further, the present invention can be fully integrated using various structures including switched capacitor structures. Besides discrete components, the present invention can also be implemented in a digital signal processor.

What is claimed is:

1. A level detector fully integrated in an integrated circuit chip for detecting a level of an input signal, comprising:
   a rectifier operatively coupled to receive the input signal and provide a rectified signal;
   an anti-aliasing filter operatively coupled to the rectifier and comprising
      a first amplifier having a signal input operatively coupled to receive the rectified signal and having a signal output for providing a filtered signal, and
      a first DC offset canceling circuit that essentially eliminates all DC voltage offsets by auto-zeroing the anti-aliasing filter and storing a first voltage offset of the first amplifier during a first time period and providing the first voltage offset to cancel a second voltage offset produced by the first amplifier during a second time period, the DC offset canceling circuit comprising
         an offset eliminating switch operatively connected to the signal input of the first amplifier;
         a switched integrating capacitor coupled to the offset eliminating switch, the switched integrating capacitor coupled to the signal output of the first amplifier;
         an auto-zeroing switch operatively connected to the signal input of the first amplifier and the signal output of the first amplifier; and one or more pairs of a series capacitor and a series switch,
         wherein the series capacitor comprises a first terminal and a second terminal, the first terminal operatively connected to the offset eliminating switch and the signal input of the first amplifier, and wherein the series switch is operatively connected to the second terminal of the series capacitor and is operatively connected to receive the rectified signal from the rectifier;

a decimator operatively coupled to the anti-aliasing filter to sample the filtered signal at a decimation sample rate and provide decimated samples of the filtered signal; and a low-pass filter operatively coupled to the decimator to receive the decimated samples of the filtered signal and to output a detected level.

2. A level detector according to claim 1, wherein the input signal comprises a voice signal and wherein the low-pass filter has a response time which tracks an amplitude of the voice signal.

3. A level detector according to claim 1, wherein the level detector is provided in a compandor.

4. A level detector according to claim 2, wherein the compandor includes a variable gain stage operatively coupled to apply a gain to the input signal based on the detected level from the low-pass filter.

5. A level detector according to claim 1, wherein the level detector is provided in a expandor.

6. A level detector according to claim 1, wherein the level detector is provided in a compressor.

7. A level detector according to claim 1, wherein the rectifier is a time-sampled full wave rectifier.

8. A level detector according to claim 1, wherein the anti-aliasing filter comprises a time-sampled anti-aliasing filter operatively coupled to the rectifier to provide the filtered signal in samples.

9. A level detector according to claim 1, wherein the anti-aliasing filter has a frequency response sufficient to attenuate high frequency components of the rectified signal at frequencies near integral multiples of the decimation sample rate.

10. A level detector according to claim 1, wherein the decimation sample rate of the decimator is chosen to minimize a total combined surface area of an integrated circuit implementation of the anti-aliasing filter and the low-pass filter.

11. A level detector according to claim 1, wherein the low-pass filter is a time-sampled low-pass filter.

12. A level detector according to claim 1, wherein the low-pass filter has a passband to pass the decimated samples of the filtered signal at frequencies below frequencies of the input signal.

13. A level detector according to claim 1, wherein the low-pass filter comprises:

a second amplifier having a signal input operatively coupled to receive the decimated samples from the decimator and having a signal output; and a second DC offset canceling circuit that essentially eliminates all DC voltage offsets, comprising a second auto-zeroed offset-storage means operatively coupled to the second amplifier for auto-zeroing the low-pass filter and for storing a third voltage offset of the second amplifier during a third time period and for providing the third voltage offset to cancel a fourth voltage offset produced by the second amplifier during a fourth time period.

14. A level detector according to claim 13, wherein the second auto-zeroed offset-storage means comprises:

an offset eliminating switch operatively connected to the signal input of the second amplifier;

a switched integrating capacitor coupled to the offset eliminating switch, the switched integrating capacitor coupled to the signal output of the second amplifier;

an auto-zeroing switch operatively connected to the switched integrating capacitor and to the offset eliminating switch; and one or more pairs of a series capacitor and a series switch, wherein the series capacitor comprises a first terminal and a second terminal, the first terminal operatively connected to the offset eliminating switch and the signal input of the second amplifier, and wherein the series switch is operatively connected to the second terminal of the series capacitor and is operatively connected to receive decimated samples from the decimator.

15. A level detector according to claim 14, wherein the input signal comprises a voice signal and wherein the switched integrating capacitor has a capacitance for the low-pass filter to have a response time which tracks an amplitude of the voice signal.

16. A level detector according to claim 13, wherein the level detector is provided in a compander and the compander comprises a variable gain stage operatively coupled to apply a gain to the input signal based on the detected level from the low-pass filter.

17. A level detector fully integrated in an integrated circuit chip for detecting a level of an input signal, comprising:

a rectifier operatively coupled to receive the input signal and provide a rectified signal;

an anti-aliasing filter operatively coupled to the rectifier, comprising a first amplifier having a signal input operatively coupled to receive the rectified signal from the rectifier and having a signal output for providing a filtered signal, and a first DC offset canceling circuit that essentially eliminates all DC voltage offsets, comprising a first offset eliminating switch operatively connected to the signal input of the first amplifier, a first switched integrating capacitor coupled to the first offset eliminating switch, the first switched integrating capacitor coupled to the signal output of the first amplifier, a first auto-zeroing switch operatively connected to the first switched integrating capacitor and to the first offset eliminating switch, and one or more pairs of a first series capacitor and a first series switch, wherein the first series capacitor comprises a first terminal and a second terminal, the first terminal operatively connected to the first offset eliminating switch and the signal input of the first amplifier, and wherein the first series switch is operatively connected to the second terminal of the first series capacitor and is operatively connected to receive the rectified signal from the rectifier;

a decimator operatively coupled to the anti-aliasing filter to sample the filtered signal from the anti-aliasing filter at a decimation sample rate and provide decimated samples of the filtered signal; and a low-pass filter operatively coupled to the decimator to receive the decimated samples of the filtered signal and output a detected level, comprising a second amplifier having a signal input operatively coupled to receive decimated samples from the decimator and having a signal output, and a second DC offset canceling circuit that essentially eliminates all DC voltage offsets, comprising a second offset eliminating switch operatively connected to the signal input of the second amplifier;

a second switched integrating capacitor coupled between the second offset eliminating switch, the second switched integrating capacitor coupled to the signal output of the second amplifier, a second auto-zeroing switch operatively connected to the second switched integrating capacitor and to the second offset eliminating switch, and one or more pairs of a second series capacitor and a second series switch, wherein the second series capacitor comprises a first terminal and a third terminal, the first terminal operatively connected to the second offset eliminating switch and the second signal input of the second amplifier, and wherein the second series switch is operatively connected to the second terminal of the second series capacitor and is operatively connected to receive decimated samples from the decimator.

18. A method of detecting a level of an input signal performed by circuitry fully-integrated in an integrated circuit chip, comprising the steps of:

(a) rectifying the input signal to provide a rectified signal;

(b) anti-alias filtering the rectified signal and amplifying the rectified signal with a first amplifier to provide a filtered signal;

(c) eliminating essentially all DC offsets introduced in step (b) by providing DC offset canceling circuitry including an offset eliminating switch operatively connected to the signal input of the first amplifier, a switched integrating capacitor coupled to the offset eliminating switch and to the signal output of the first amplifier, an auto-zeroing switch operatively connected to the signal input of the first amplifier and the signal output of the first amplifier; and one or more pairs of a series capacitor and a series switch, wherein the series capacitor comprises a first terminal and a second terminal, the first terminal operatively connected to the offset eliminating switch and the signal input of the first amplifier, and wherein the series switch is operatively connected to the second terminal of the series capacitor and is operatively connected to receive the rectified signal from the rectifier;

auto-zeroing the anti-alias filtering by storing a first voltage offset in the DC offset canceling circuitry during a first time period and using the first voltage offset to cancel a second voltage offset generated during a second time period;

(d) decimating the filtered signal at a decimation sample rate to provide decimated samples of the filtered signal; and (e) low-pass filtering the decimated samples to output a detected level.

19. A method according to claim 18, wherein the step (b) of anti-aliasing filtering filters the input signal in discrete time samples to provide the filtered signal in samples.

20. A method according to claim 18, wherein the step (b) of anti-alias filtering filters the rectified signal with a frequency response sufficient to attenuate high frequency components of the rectified signal at frequencies near integral multiples of the decimation sample rate.

21. A method according to claim 18, wherein the step (e) of low-pass filtering filters with a passband to pass the decimated signals at frequencies below frequencies of the input signal.

22. A method according to claim 18, wherein the input signal comprises a voice signal and wherein the step (e) of low-pass filtering filters with a response time which tracks an amplitude of the voice signal.

23. A method according to claim 18, further comprising the step of (f) companding by variably applying a gain to the input signal in accordance with the detected level provided by the low-pass filtering of the step (e).

24. A method according to claim 18, further comprising the step of (f) eliminating essentially all DC offsets introduced in step (e) by auto-zeroing the low-pass filtering and by storing a third voltage offset during a third time period and using the third voltage offset to cancel a fourth voltage offset during a fourth time period.

* * * * *